United States Patent [19]

Boardman et al.

[11] 3,905,816

[45] Sept. 16, 1975

[54] PREPARING LITHOGRAPHIC PLATES UTILIZING HYDROLYZABLE AZO AND AZIDO-SILANE COMPOUNDS

[75] Inventors: Harold Boardman, Chadds Ford, Pa.; Richard L. Wagner, Wilmington, Del.

[73] Assignee: Hercules Incorporated, Wilmington, Del.

[22] Filed: June 27, 1974

[21] Appl. No.: 483,855

[52] U.S. Cl. .................... 96/33; 96/115 P; 96/91 R; 96/91 N

[51] Int. Cl.[2] ............................................ G03F 7/02

[58] Field of Search ......... 96/33, 115 P, 91 R, 91 N

[56] References Cited

UNITED STATES PATENTS

| | | | |
|---|---|---|---|
| 3,163,534 | 12/1964 | Adams et al. | 96/33 |
| 3,520,683 | 7/1970 | Kerwin | 96/91 N |
| 3,606,922 | 9/1971 | Doggett | 96/33 |
| 3,615,538 | 10/1971 | Peters et al. | 96/33 |
| 3,782,940 | 1/1974 | Ohto et al. | 96/115 P |

*Primary Examiner*—Norman G. Torchin
*Assistant Examiner*—Judson R. Hightower
*Attorney, Agent, or Firm*—Marion C. Staves

[57] ABSTRACT

It has been found that lithographic printing plates can be prepared by (a) photografting to an oleophilic organic polymer substrate a potentially hydrophilic hydrolyzable azo- or azido-silane compound having the general formula $$(X)_a\text{—}\overset{\displaystyle (T)_b\atop|}{\text{Si}}\text{—}(R\text{—}Z)_c$$

where R is an organic radical, X is selected from mono and dialkyl amino, alkyl and aryl amido, alkoxy, aryloxy and alkyl and aryl oxycarbonyl radicals; T is selected from alkyl, cycloalkyl, aryl, alkaryl and aralkyl radicals and the corresponding halogenated radicals; *a* is an integer from 1 to 3; *b* is an integer from 0 to 2; *c* is an integer from 1 to 3; and *a+b+c* equals 4; and Z is selected from $$\text{—O—}\overset{\displaystyle O\atop\|}{C}\text{—}N_3,\quad \text{—O—}\overset{\displaystyle O\atop\|}{C}\text{—}CHN_2,\quad\text{and}\quad \text{—O—}\overset{\displaystyle O\atop\|}{C}\text{—}\underset{\displaystyle \|\atop N_2}{C}\text{—}\overset{\displaystyle O\atop\|}{C}\text{—OR'}$$

where R′ is selected from an alkyl, cycloalkyl, aryl, alkaryl, or aralkyl radicals, (b) washing away non-photografted azo- or azido-silane compound, and (c) amplifying the hydrophilicity of the hydrolyzed silane groups by treating with a soluble silicate solution or a colloidal silica dispersion.

7 Claims, No Drawings

PREPARING LITHOGRAPHIC PLATES UTILIZING HYDROLYZABLE AZOAND AZIDO-SILANE COMPOUNDS

This invention relates to a novel method for preparing lithographic printing plates. More particularly, this invention relates to a method for preparing lithographic printing plates by imagewise photochemically grafting an azo- or azido-silane compound to an oleophilic organic polymer substrate, washing away non-grafted compound, and then amplifying the hydrophilicity of the hydrolyzed silane groups.

It is known to modify the surface of various hydrophilic substrates by photocrosslinking imagewise a thin layer of resin coated on the substrate. After washing away the uncrosslinked resin, the resulting plate consists of oleophilic crosslinked resin printing areas, and the hydrophilic substrate non-printing areas.

It has now been found that lithographic printing plates of excellent quality can be prepared by (1) photografting imagewise to an oleophilic organic polymer substrate a potentially hydrophilic hydrolyzable azo- or azido-silane compound, (2) washing away non-grafted azo- or azido-silane compound, and (3 ) amplifying the hydrophilicity of the hydrolyzed silane groups by treating with a soluble silicate solution or a colloidal silica dispersion. By "photografting" is meant the direct photo-initiated chemical coupling reaction of an azo- or azido-silane compound with an organic polymer. By "amplifying the hydrophilicity" is meant reacting the grafted hydrolyzed silane groups with soluble silicates or colloidal silica thus greatly increasing the hydrophilic character of the grafted sites.

Any organic polymer can be used as the substrate in accordance with this invention, that is, oleophilic (i.e., wettable by organic solvent-based inks) but not soluble in or swollen by solvent-based printing inks. Thus, most amorphous polymers with a second order transition temperature below about 50°C. must be crosslinked to some degree to provide such solvent resistance. Typical applicable polymers are the hydrocarbon polymers, including saturated and unsaturated, crystalline and amorphous polyolefins, as, for example, polyethylene, polypropylene, ethylene-propylene random crystalline copolymers containing up to 10% ethylene, ethylene-propylene block crystalline copolymers containing up to 25% ethylene, crosslinked ethylene-propylene amorphous copolymers; crosslinked rubbers, including butyl rubber, natural rubber, styrene-butadiene rubber, cis-1,4-polyisoprene, and ethylene-propylene-dicyclopentadiene terpolymers; other hydrocarbon polymers such as polystyrene; and blends of these polymers with each other or non-hydrocarbon polymers.

In addition to the hydrocarbon polymers, most non-hydrocarbon polymers including copolymers, terpolymers, etc., can also be used. Typical of these non-hydrocarbon polymers are the cellulose esters such as cellulose acetate butyrate; polyesters such as poly(ethylene terephthalate), drying and non-drying alkyd resins, etc.; the polyamides such as nylon 6, nylon 66, etc.; allyl pentaerythritol derivatives such as the condensate of triallyl pentaerythritol with diallylidene pentaerythritol, esters of triallyl pentaerythritol and drying oil fatty acids, etc.; the poly(vinyl alkyl ethers) such as poly(vinyl n-butyl ether), etc.; the poly(vinyl acetals) such as poly(vinyl butyral), etc.; the vinyl chloride polymers containing at least 10 mole percent of vinyl chloride such as poly(vinyl chloride), vinyl chloride-vinyl acetate copolymers, vinyl chloride-vinylidene chloride copolymers, vinyl chloride-maleic anhydride copolymers, vinyl chloride-fumaric acid copolymers, vinyl chloride-vinyl acetal copolymers such as the vinyl chloride-vinyl butyral copolymers, vinyl chloride-vinylidene chloride-acrylonitrile terpolymers, vinyl chloride-vinyl acetate-maleic anhydride terpolymers, etc.; nitrocellulose; chlorinated natural rubber; sulfochlorinated polyethylene; polysulfide rubber; polyurethane rubber; poly(vinyl acetate); ethylene-vinyl acetate copolymers; poly(vinylidene chloride; vinylidene chloride-acrylonitrile copolymers; ethyl acrylate-2-chloroethyl vinyl ether copolymers; poly(ethyl acrylate); poly(ethyl methacrylate); poly-3,3-bis(-chloromethyl)oxetane; vinyl modified polydimethyl siloxane; polychloroprene; butadiene-acrylonitrile copolymers; poly(epichlorohydrin); epichlorohydrin-ethylene oxide copolymers; epichlorohydrin-propylene oxide copolymers; epichlorohydrin-ethyl glycidyl ether copolymers; polyesters of saturated and unsaturated dibasic acids and bisphenol A -propylene oxide condensates, polycarbonates, polyacetals, etc.

If desirable, the organic polymer substrate may have some sort of semi-rigid backing, such as a metal, cardboard, or another polymer backing.

The azo- or azido-silane compounds to be photografted to the olefin organic polymer substrate will have the general formula $$(X)_a\!-\!\overset{\displaystyle (T)_b}{\overset{|}{Si}}\!-\!(R\!-\!Z)_c$$

where R is an organic radical, X is selected from mono and dialkyl amino, alkyl and aryl amido, alkoxy, aryloxy and alkyl and aryl oxycarbonyl radicals; T is selected from alkyl, cycloalkyl, aryl, alkaryl and aralkyl radicals and the corresponding halogenated radicals, where most preferably the alkyl groups will contain 1 to 18 carbon atoms, the cycloalkyl groups will contain 5 to 8 carbon atoms, and the aryl groups will contain one to two rings; *a* is an integer from 1 to 3; *b* is an integer from 0 to 2; *c* is an integer from 1 to 3; and a+b+c equals 4; and Z is selected from $$-O-\overset{O}{\overset{\|}{C}}N_3,\qquad -O-\overset{O}{\overset{\|}{C}}-CHN_2,$$

and $$-O-\overset{O}{\overset{\|}{C}}-\underset{\underset{N_2}{\|}}{C}-\overset{O}{\overset{\|}{C}}-OR'$$

where R' is selected from alkyl, cycloalkyl, aryl, alkaryl or aralkyl radicals, where most preferably the alkyl groups will contain 1 to 18 carbon atoms, the cycloalkyl groups will contain 5 to 8 carbon atoms, and the aryl groups will contain one to two rings.

Most preferably, R will be an organic radical selected from the group consisting of alkylene, cycloalkylene, arylene, alkarylene, aralkylene, alkyl diarylene, aryl dialkylene, alkyl dicycloalkylene, cycloalkyl dialkylene, alkylene-oxy-alkylene, arylene-oxy-arylene, alkarylene-oxy-arylene, alkarylene-oxy-alkarylene, aralkylene-oxy-alkylene, and aralkylene-oxy-aralkylene; as well as the corresponding halogenated radicals, where the alkyl and alkylene groups will contain 1 to 18 carbon atoms, the cycloalkyl and cycloalkylene groups will contain 5 to 8 carbon atoms, and the aryl and arylene groups will contain one to two rings.

Typical azo- or azido-silane compounds are:

$N_3\overset{O}{\overset{\|}{C}}-O-(CH_2)_3-Si(OCH_3)_3$ $N_3\overset{O}{\overset{\|}{C}}-O-(CH_2)_3-Si[O(CH_2)_3CH_3]_3$ $N_3\overset{O}{\overset{\|}{C}}-O-(CH_2)_3-Si[O(CH_2)_3CH_2Cl]_3$ $N_3\overset{O}{\overset{\|}{C}}-O-(CH_2)_3-Si[O(CH_2)_6CH_3]_3$ $N_3\overset{O}{\overset{\|}{C}}-O-(CH_2)_3-Si[O(CH_2)_{17}CH_3]_3$

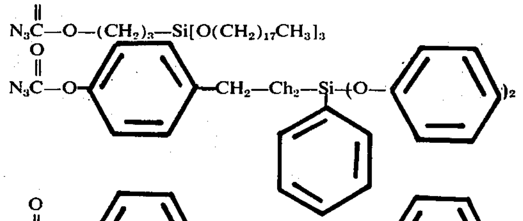

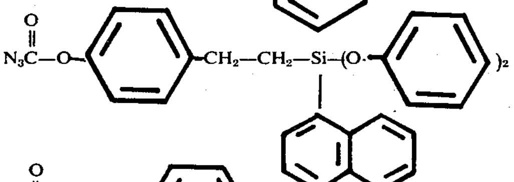

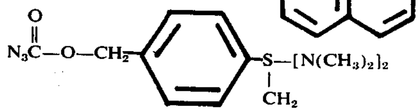

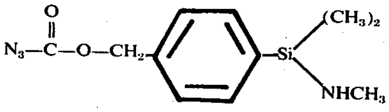

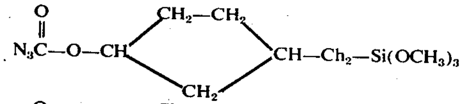

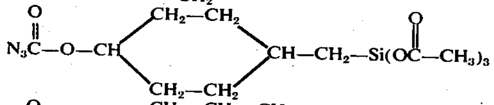

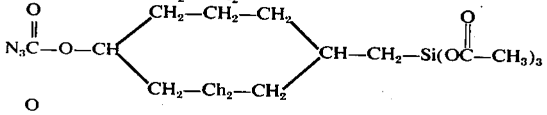

$N_3\overset{O}{\overset{\|}{C}}-O-(CH_2)_2-O-(CH_2)_2-Si(OCH_2CH_3)_3$

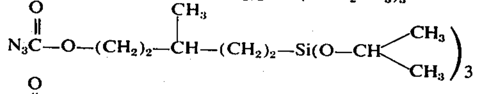

$N_3\overset{O}{\overset{\|}{C}}-O-(CH_2)_8-Si(OCH_3)_3$ $N_3\overset{O}{\overset{\|}{C}}-O-CH_2)_{10}-Si(OCH_3)_3$ $N_3\overset{O}{\overset{\|}{C}}-O-(CH_2)_{18}-Si(OCH_3)_3$

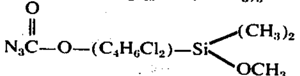

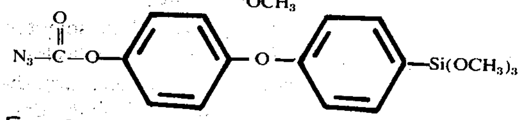

$\left[N_3-\overset{O}{\overset{\|}{C}}-O-(CH_2)_3\right]_2 Si(OCH_3)_2$ $\left[N_3-\overset{O}{\overset{\|}{C}}-O-(CH_2)_3\right]_3 SiOCH_3$ $N_3-\overset{O}{\overset{\|}{C}}-O-(CH_2)_3-Si-(N\overset{O}{\overset{\|}{C}}-CH_3)_3$

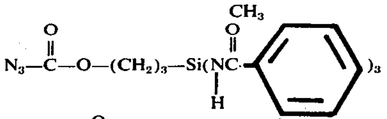

$N_2{=}CH_2-\overset{O}{\overset{\|}{C}}-O-(CH_2)_{10}-O-\overset{O}{\overset{\|}{C}}-NH-(CH_2)_3-Si)OCH_3)_3$ $N_2{=}CH_2-\overset{O}{\overset{\|}{C}}-O-CH_2-Si(OCH_3)_3$ $N_2{=}CH_2-\overset{O}{\overset{\|}{C}}-O-(CH_2)_3-Si(OCH_3)_3$ $N_2{=}CH_2-\overset{O}{\overset{\|}{C}}-O-(CH_2)_3-Si[O(CH_2)_3CH_2Cl]_3$ $N_2{=}CH_2-\overset{O}{\overset{\|}{C}}-O-(CH_2)_3-Si[O(CH_2)_5CH_3]_3$ $N_2{=}CH_2-\overset{O}{\overset{\|}{C}}-O-(CH_2)_3-Si[O(CH_2)_{17}CH_3]_3$ $N_2{=}CH_2-\overset{O}{\overset{\|}{C}}-O-(CH_2)_{10}-Si(OCH_3)_3$ $N_2{=}CH_2-\overset{O}{\overset{\|}{C}}-O-(CH_2)_{18}-Si(OCH_3)_3$

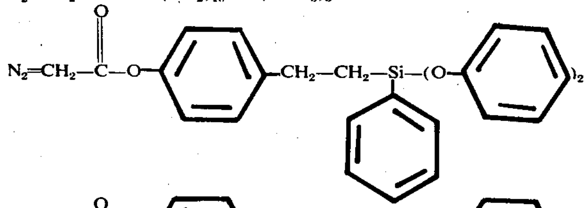

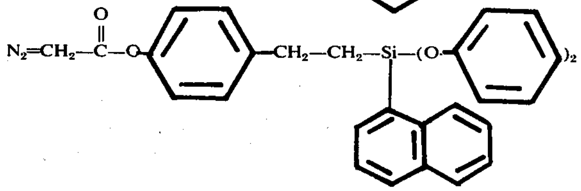

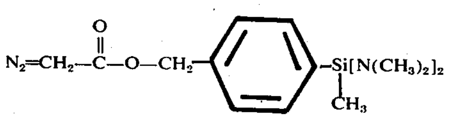

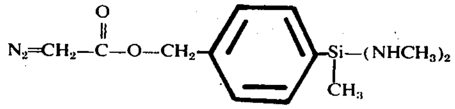

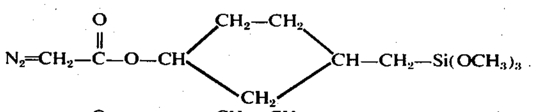

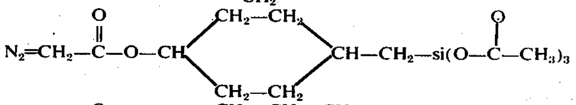

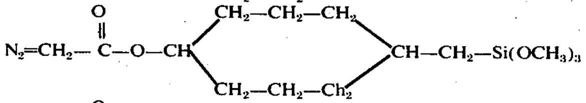

$N_2{=}CH_2-\overset{O}{\overset{\|}{C}}-O-(CH_2)_2-O-(CH_2)_2-Si(OCH_2CH_3)_3$ $N_2{=}CH_2-\overset{O}{\overset{\|}{C}}-O-(CH_2)_2-\overset{Cl}{\overset{|}{C}}H-(CH_2)_2-Si\left(OCH(CH_3)_2\right)_3$

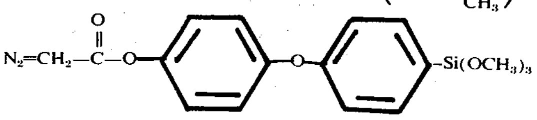

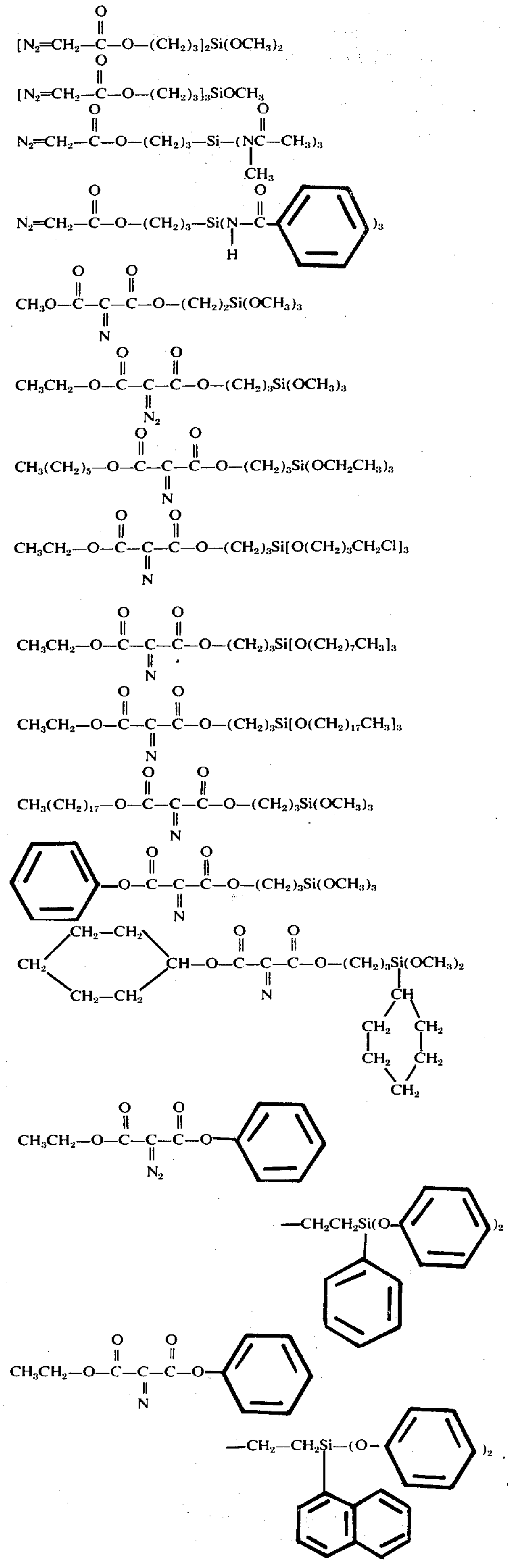

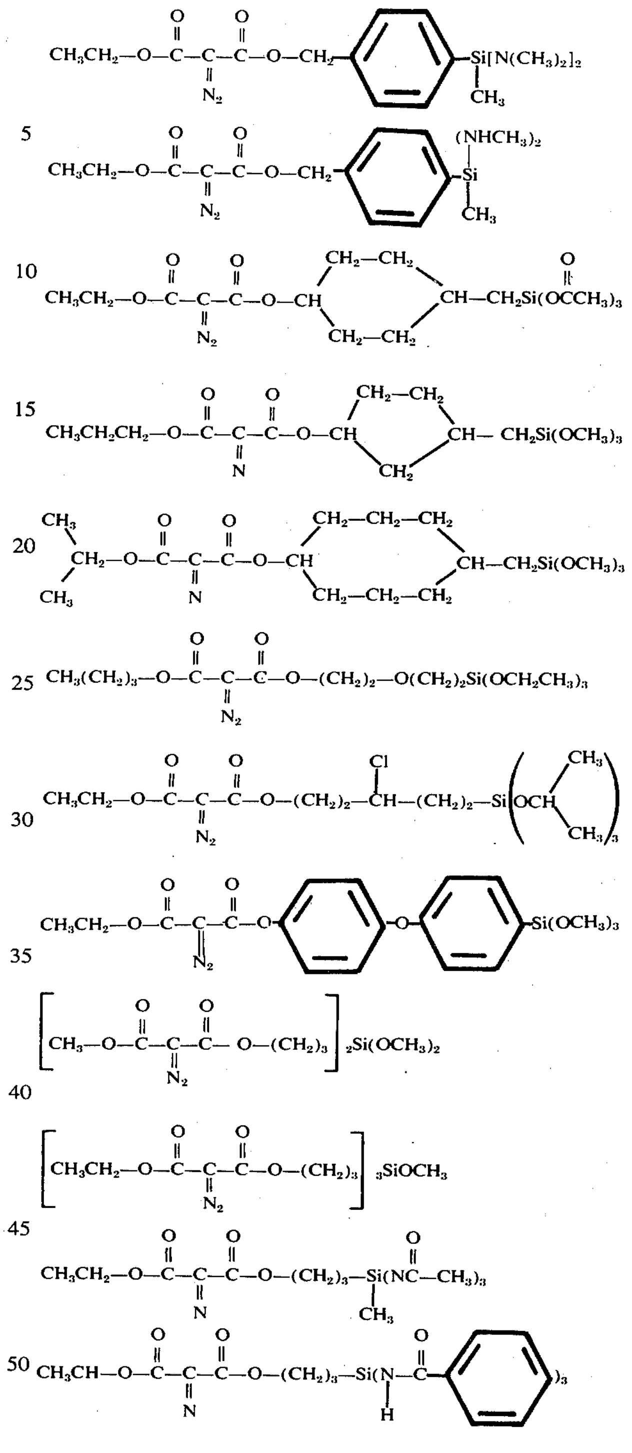

All of the above azo- or azido-silane compounds are photo-sensitive, i.e., they can be photografted to the organic polymer substrate merely by being subjected to ultraviolet light radiation in the wave length range of 2000 to 4000 angstroms.

The oleophilic organic polymer substrate can be coated with the silane compound in a number of ways, as for example, dipping, brushing, rolling, etc., a solution or dispersion of the compound on the substrate. Typical solvents for the silane compounds are methanol, methylene chloride, acetone, methyl ethyl ketone and combinations of such solvents with water. Since the silane groups are to be amplified, it is only necessary to coat with a very thin layer of silane compound.

Most preferably, at least about $10^{-9}$ moles per $cm^2$ will be used.

The amount of light radiation required to initiate grafting will vary, depending upon the azo- or azido-silane compound being grafted. In general, photografting can be completed in a few seconds to 40 minutes. The optimum period of time and optimum wave length range of radiation required to initiate photografting using any particular silane compound can readily be determined by one skilled in the art.

Non-grafted silane compound can be removed from unexposed areas by washing with a solvent with or without scrubbing or brushing. Suitable solvents for removing the unreacted silane depend on the nature of the compound, but typically would be the same type as used to apply the compound. If water is present during the washing stage, hydrolyzable groups of the reacted silane will be hydrolyzed at this stage.

As pointed out above, the hydrolyzed silane groups on the photografted silane compound are treated with a silicate solution or a colloidal silica suspension to amplify their hydrophilicity. Any water-soluble silicate, including both alkali and quaternary ammonium salts, can be used, as well as any silica which can form a colloidal suspension. In some cases it may be desirable to use a mixture of soluble silicate and colloidal silica. There is not a definite distinction between soluble silicates and colloidal silicas, the difference between the two classes being arbitrary. Soluble silicates range from the alkali metal orthosilicates ($2M_2O.SiO_2$, M = alkali metal), sesquisilicates ($3M_2O.SiO_2$), and metasilicates ($M_2O.SiO_2$), through higher molecular weight polysilicates with high average $SiO_2/M_2O$ ratios. As the $SiO_2/M_2O$ ratio increases, aqueous solutions become more viscous. At still higher ratios, the silicates give the typical opalescence and bluish cast due to light scattering. The system can, at this point, be considered an aqueous colloidal dispersion of discrete particles of surface hydroxylated silica. The choice of alkali metal, pH, and concentration of added aluminum oxide or other chemical modifiers affects the $SiO_2/M_2O$ ratio at which a true colloid may be said to exist. When a colloid is formed, the $SiO_2/M_2O$ ratio is so high that the bulk of the amorphous masses which have formed is largely $SiO_2$. The surface of the particles are made up of —SiOH and —$SiO^-M^+$ functionality. The positive ions are in solution. The charge layers at each particle surface repel one another, stabilizing the sol. Soluble and colloid silicates can also be prepared with other monovalent positive counter ions in addition to the alkali metals, for example, quaternary ammonium salts, such as tetraethanolammonium silicate and tetraethyl silicate, and other ammonium derivatives. Typical alkali metal silicates are sodium silicate, potassium silicate, lithium silicate. Typical colloidal silicas are Ludox HS-40, HS, LS, SM-30, TM, AS, and AM (E. I. duPont). These materials vary in colloidal particle size, pH stabilizing ion, $SiO_2/M_2O$ ratio, etc.

The silicate or silica amplifying agents can be applied to the previously photografted surfaces by a number of methods. By one method, the photografted polymer plate is merely soaked in a silicate solution or colloidal suspension of silica. Soaking for a period of from about 1 minute to as much as several hours at a temperature from room temperature to about 90°C. will generally be sufficient. Other methods of applying the silicate or silica amplifying agents are by wiping, brushing or pouring the solution or suspension onto the plate surface. The amount of amplifying agent applied will be sufficient to react with all the silane groups photografted on the polymer substrate. In general, solutions of silicates or suspensions of colloidal silica will contain from about 1% to about 40%, by weight of amplifier.

Periodic retreatment of the plate after use may also be desirable to restore the hydrophilic properties.

As demonstrated in the working examples, the preparation of lithographic plates by the claimed photografting and amplification process offers several advantages. First, the process is a way of making positive working lithographic plates. Second, expensive and toxic organic solvents are not required in the developing step. Third, the quality of the plate can be renewed after use or storage.

The following examples are presented for purposes of illustration, parts and percentages being by weight unless otherwise specified.

EXAMPLE 1

This example illustrates photografting an alkyl azidoformate silane to a crosslinked polyester resin substrate and then amplifying with a silicate.

A 5 mil grained aluminum lithographic plate was coated, using a Meyer rod with 6 mil wire, with an anhydrous Cellosolve acetate solution containing approximately 30 parts of a polyester resin prepared from fumaric acid and the diol prepared by condensing propylene oxide with Bisphenol A and having a molecular weight of approximately 3000, 11.5 parts of a trifunctional isocyanate crosslinking agent, the reaction product of 3 moles of hexamethylene diisocyanate and one mole of water, named as the biuret of hexamethylene diisocyanate, and composed principally of a compound believed to have the structure:

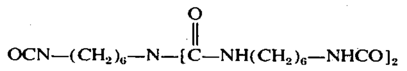

and 1 part of zinc acetate. The thus coated plate was cured in an air circulating oven for one hour at a temperature of 120°C. This plate was then coated with a benzene solution of azidocarbonyloxypropyl trimethoxysilane having the formula:

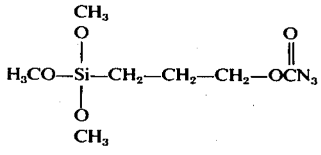

so as to give a surface concentration of $10^{-5}$ moles per $cm^2$. The resulting plate was exposed through a stencil to a low pressure mercury arc lamp (ultraviolet light) for 40 minutes. After exposure the plate was washed with benzene and then soaked in a 26% potassium silicate solution for 16 hours. It was then wiped with processing gum and inked with a lithographic developing ink to render the image pattern visible. The plate was used on a lithographic press to make over 1000 satisfactory impressions.

EXAMPLE 1*a*

This example illustrates amplification by use of a silicate at low concentration.

A plate was prepared as in Example 1, except the amplification procedure was modified as follows. The imaged plate was soaked in a 5% solution of potassium silicate for 30 minutes. The plate was run on a lithographic press with satisfactory results.

EXAMPLE 1*b*

This example illustrates the retreatment of a deteriorated lithographic plate with a silicate solution to restore performance.

The process of Example 1 was repeated. The resulting plate was allowed to run on a lithographic press until the hydrophilic areas began to deteriorate by scumming. The press was stopped and ink removed from the plate with solvent. The plate was then rubbed vigorously with a pad saturated with a 13% aqueous solution of potassium silicate. After 5 minutes, the excess silicate solution was wiped off with a water-soaked pad. The press was restarted and the printing was satisfactory, showing that the hydrophilic areas of the plate had been restored.

EXAMPLE 2

This example illustrates photografting an azidocarbonyloxypropyl silane to a crosslinked polyester resin substrate and then amplifying with a combination of silicate and silica.

The procedure of Example 1 was repeated exactly except the soaking in potassium silicate solution was replaced by soaking for 5 hours in a 1:1 mixture of 39% aqueous potassium silicate solution and 30% colloidal sodium ion stabilized silica dispersion (containing 30.0% $SiO_2$ and 0.2% $Al_2O_3$ with a $SiO_2/Na_2O$ weight ratio of 230 dispersed as 13—14 mμ diameter particles in water). The plate was run on a lithographic press for over 3000 impressions with satisfactory results.

EXAMPLE 3

This example illustrates photografting of an azidocarbonyloxypropyl silane to a crosslinked polyester resin substrate and then amplifying with an organic colloidal silica.

The procedure of Example 1 was repeated exactly except the soaking in potassium silicate was replaced by soaking for 5 hours in a 15% ammonium ion stabilized silica dispersion (containing 15.0% $SiO_2$ with a $SiO/NH_3$ weight ratio of 20 dispersed as 13 to 15 mμ particles in water. The plate was run on a lithographic press for over 3000 impressions with satisfactory results.

EXAMPLES 4—13

These examples illustrate photografting of an azidocarbonyloxypropyl silane to a crosslinked polyester resin substrate and then amplifying with a variety of colloidal silicas and silicates.

The procedure of Example 1 was repeated exactly except the colloidal ammonium silicate was replaced by other silicate solutions or silica dispersions.

| Ex. No. | Form | $SiO_2$ Conc. | Counter ion | $SiO_2/M_2O$ wt. ratio | Particle Size |
|---|---|---|---|---|---|
| 4 | colloidal silica | 40.0% | sodium | 93 | 13–14 mμ |
| 5 | colloidal silica | 30.0 | sodium | 300 | 15–16 |
| 6 | colloidal silica | 30.0 | sodium | 50 | 7–8 |
| 7 | colloidal silica | 49.0 | sodium | 230 | 13–14 |
| 8 | colloidal silica surface modified with aluminum | 30.0 | sodium | 230 | 13–14 |
| 9 | silicate solution | 33.2 | sodium | 2.4 | — |
| 10 | silicate solution | 20.8 | potassium | 2.5 | — |
| 11 | silicate solution | 29.5 | potassium | 1.8 | — |
| 12 | silicate solution | 20.0 | lithium | 9.6 | — |
| 13 | silicate solution | 30.0 | tetraethanol ammonium | 7.5 | — |

Each plate was run on a lithographic press for over 3000 impressions with satisfactory results.

EXAMPLE 14

The example illustrates photografting of an azidocarbonyloxypropyl silane to a poly(ethylene terephthalate) substrate and then amplifying with a silicate.

The procedure of Example 1 was repeated, except a 5 mil film of poly(ethylene terephthalate) was substituted for the polyester-coated aluminum lithographic plate. After imaging and silicate amplification, the plate was run on a lithographic press for over 1000 impressions with satisfactory results.

EXAMPLE 15

This example illustrates photografting of an azidocarbonyloxypropyl silane to a polypropylene substrate and then amplification with a silicate.

The procedure of Example 1 was repeated, except a 5 mil film of polypropylene was substituted for the polyester coated aluminum plate. After imaging and silicate amplification, the plate was run on a lithographic press for over 1000 impressions with satisfactory results.

EXAMPLES 16–26

These examples illustrate the photografting of a variety of azidocarbonyl silanes to a polyester substrate and amplifying with a silicate.

The procedure of Example 1 was repeated exactly except the azidocarbonyloxypropyl silane indicated was replaced by other azidocarbonyloxy silanes:

EXAMPLE 16

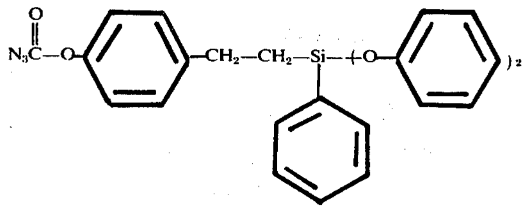

EXAMPLE 17

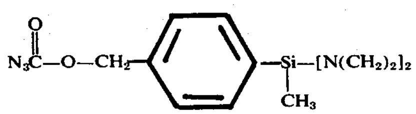

EXAMPLE 18

EXAMPLE 19

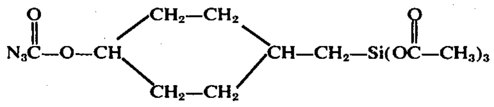

EXAMPLE 20

$$N_3\overset{O}{\overset{\|}{C}}-O-(CH_2)_2-O-(CH_2)_2-Si(OCH_2CH_3)_3$$

EXAMPLE 21

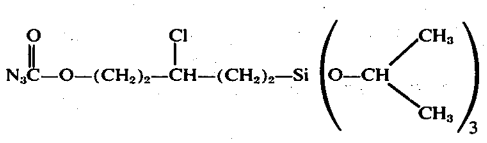

EXAMPLE 22

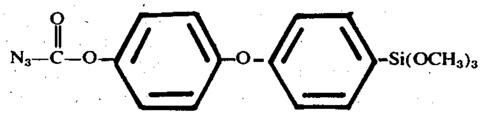

EXAMPLE 23

$$[N_3-\overset{O}{\overset{\|}{C}}-O-(CH_2)_3]_2Si(OCH_3)_2$$

EXAMPLE 24

$$[N_3-\overset{O}{\overset{\|}{C}}-O(CH_2)_3]_3SiOCH_3$$

EXAMPLE 25

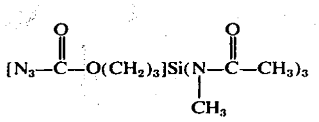

EXAMPLE 26

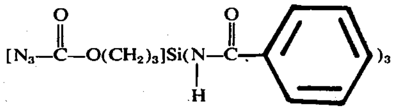

In each sample the plate was run on a lithographic press for over 1000 impressions with satisfactory results.

EXAMPLE 27

This example illustrates photografting of a diazoacetate silane to a crosslinked polyester resin substrate and then amplifying with a silicate.

The procedure of Example 1 was repeated, except a 1-butanol solution of a diazoacetate silane having the formula $$N_2{=}CH_2-\overset{O}{\overset{\|}{C}}-O-(CH_2)_{10}-Si(OCH_3)_3$$

was used in place of the solution of the azidocarbonyloxypropyl trimethoxysilane, and the exposure was to a Hanovia 30600 mercury lamp for 5 minutes through a cellulose acetate negative. After exposure and amplification, the plate was used on a lithographic press to make over 1000 satisfactory impressions.

EXAMPLE 28

This example illustrates photografting a diazoacetate silane to a crosslinked unsaturated polyester resin substrate and then amplifying with a combination of silicate and silica.

The procedure of Example 27 was repeated exactly except the soaking in potassium silicate solution was replaced by soaking for 5 hours in a 1:1 mixture of 39% aqueous potassium silicate solution and 30% colloidal sodium ion stabilized silica dispersion (containing 30.0% $SiO_2$ and 0.2% $Al_2O_3$ with a $SiO_2/Na_2O$ weight ratio of 230 dispersed as 13–14 m$\mu$ diameter particles in water). The plate was run on a lithographic press for over 3000 impressions with satisfactory results.

EXAMPLE 29

This example illustrates photografting of a diazoacetate silane to a crosslinked polyester resin substrate and then amplifying with an organic colloidal silica.

The procedure of Example 27 was repeated exactly except the soaking in potassium silicate was replaced by soaking for 5 hours in a 15% ammonium ion stabilized silica dispersion (containing 15.0% $SiO_2$ with a $SiO_2/NH_3$ weight ratio of 20 dispersed as 13 to 14 m$\mu$ particles in water). The plate was run on a lithographic press for over 3000 impressions with satisfactory results.

EXAMPLES 30–39

These examples illustrate photografting of a diazoacetate silane to a crosslinked polyester resin substrate and then amplifying with a variety of colloidal silicas and silicates.

The procedure of Example 27 was repeated exactly except the colloidal ammonium silicate was replaced by other silicate solutions or silica dispersions.

| Ex. No. | Form | $SiO_2$ Conc. | Counter ion | $SiO_2/M_2O$ wt. ratio | Particle Size |
|---|---|---|---|---|---|
| 30 | colloidal silica | 40.0% | sodium | 93 | 13–14 mμ |
| 31 | colloidal silica | 30.0 | sodium | 300 | 15–16 |
| 32 | colloidal silica | 30.0 | sodium | 50 | 7–8 |
| 33 | colloidal silica | 49.0 | sodium | 230 | 13–14 |
| 34 | colloidal silica surface modified with aluminum | 30.0 | sodium | 230 | 13–14 |
| 35 | silicate solution | 33.2 | sodium | 2.4 | — |
| 36 | silicate solution | 20.8 | potassium | 2.5 | — |
| 37 | silicate solution | 29.5 | potassium | 1.8 | — |
| 38 | silicate solution | 20.0 | lithium | 9.6 | — |
| 39 | silicate solution | 30.0 | tetraethanol ammonium | 7.5 | — |

Each plate was run on a lithographic press for over 3000 impressions with satisfactory results.

EXAMPLE 40

This example illustrates photografting of a diazoacetate silane to a poly(ethylene terephthalate) substrate and then amplifying with a silicate.

The procedure of Example 27 was repeated except a 5 mil film of poly(ethylene terephthalate) was substituted for the polyester-coated aluminum lithographic plate. After imaging and silicate amplification the plate was run on a lithographic press for over 1000 impressions with satisfactory results.

EXAMPLE 41

This example illustrates photografting of a diazoacetate silane to a polypropylene substrate and then amplification with a silicate.

The procedure of Example 27 was repeated except a 5 mil film of polypropylene was substituted for the polyester-coated aluminum plate. After imaging and silicate amplification, the plate was run on a lithographic press for over 1000 impressions with satisfactory results.

EXAMPLES 42–52

These examples illustrate the photografting of a variety of diazoacetate silanes to a polyester substrate and then amplifying with a silicate.

The procedure of Example 28 was repeated exactly except the diazoacetate silane indicated was replaced by other diazoacetate silanes:

EXAMPLE 42

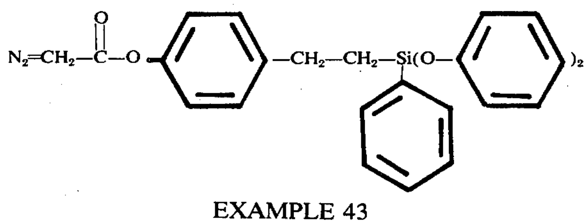

EXAMPLE 43

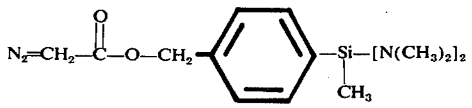

EXAMPLE 44

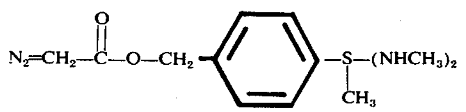

EXAMPLE 45

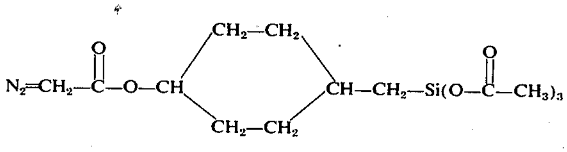

EXAMPLE 46

$N_2{=}CH_2{-}C(=O){-}O{-}(CH_2)_2{-}O{-}(CH_2)_2{-}Si(OCH_2CH_3)_3$

EXAMPLE 47

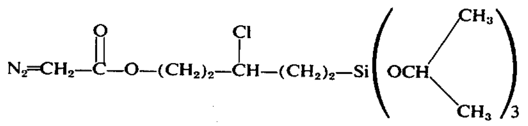

EXAMPLE 48

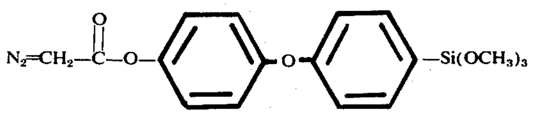

EXAMPLE 49

$[N_2{=}CH_2{-}C(=O){-}O{-}(CH_2)_3]_2Si(OCH_3)_2$

EXAMPLE 50

$[N_2{=}CH_2{-}C(=O){-}O{-}(CH_2)_3]SiOCH_3$

EXAMPLE 51

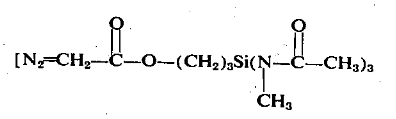

EXAMPLE 52

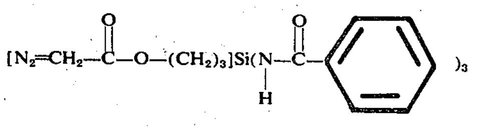

In each example the plate was run on a lithographic press for over 1000 impressions with satisfactory results.

EXAMPLE 53

This example illustrates photografting of a diazomalonate silane to a crosslinked polyester resin substrate and then amplifying with a silicate.

The procedure of Example 1 was repeated, except a 1-butanol solution of a diazomalonate silane having the formula

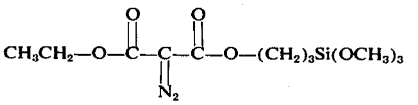

was used in place of the solution of the azidocarbonyloxypropyl trimethoxysilane, and the exposure was for 30 minutes. After exposure and amplification, the plate was used on a lithographic press to make over 1000 satisfactory impressions.

EXAMPLE 54

This example illustrates photografting a diazomalonate silane to a crosslinked unsaturated polyester resin substrate and then amplifying with a combination of silicate and silica.

The procedure of Example 53 was repeated exactly except the soaking in potassium silicate solution was replaced by soaking for 5 hours in a 1:1 mixture of 39% aqueous potassium silicate solution and 30% colloidal sodium ion stabilized silica dispersion (containing 30.0% $SiO_2$ and 0.2% $Al_2O_3$ with a $SiO_2/Na_2O$ weight ratio of 230 dispersed as 13–14 mμ diameter particles in water). The plate was run on a lithographic press for over 3000 impressions with satisfactory results.

EXAMPLE 55

This example illustrates photografting of a diazomalonate silane to a crosslinked polyester resin substrate and then amplifying with an organic colloidal silica.

The procedure of Example 53 was repeated exactly except the soaking in potassium silicate was replaced by soaking for 5 hours in a 15% ammonium ion stabilized silica dispersion (containing 15.0% $SiO_2$ with a $SiO_2/NH_3$ weight ratio of 20 dispersed as 13 to 14 mμ particles in water). The plate was run on a lithographic press for over 3000 impressions with satisfactory results.

EXAMPLES 56–65

These examples illustrate photografting of diazomalonate silane to a crosslinked polyester resin substrate and then amplifying with a variety of colloidal silicas and silicates.

The procedure of Example 53 was repeated exactly except the colloidal ammonium silicate was replaced by other silicate solutions or silica dispersions.

| Ex. No. | Form | $SiO_2$ Conc. | Counter ion | $SiO_2$/ $M_2O$ wt. ratio | Particle Size |
|---|---|---|---|---|---|
| 56 | colloidal silica | 40.0% | sodium | 93 | 13–14 mμ |
| 57 | colloidal silica | 30.0 | sodium | 300 | 15–16 |
| 58 | colloidal silica | 30.0 | sodium | 50 | 7–8 |
| 59 | colloidal silica | 49.0 | sodium | 230 | 13–14 |
| 60 | colloidal silica surface modified with aluminum | 30.0 | sodium | 230 | 13–14 |
| 61 | silicate solution | 33.2 | sodium | 2.4 | — |
| 62 | silicate solution | 20.8 | potassium | 2.5 | — |
| 63 | silicate solution | 29.5 | potassium | 1.8 | — |
| 64 | silicate solution | 20.0 | lithium | 9.6 | — |
| 65 | silicate solution | 30.0 | tetraethanol ammonium | 7.5 | — |

Each plate was run on a lithographic press for over 3000 impressions with satisfactory results.

EXAMPLE 66

This example illustrates photografting of a diazomalonate silane to a poly(ethylene terephthalate) substrate and then amplifying with a silicate.

The procedure of Example 53 was repeated except a 5 mil film of poly(ethylene terephthalate) was substituted for the polyester-coated aluminum lithographic plate. After imaging and silicate amplification, the plate was run on a lithographic press for over 1000 impressions with satisfactory results.

EXAMPLE 67

This example illustrates photografting of a diazomalonate silane to a polypropylene substrate and then amplification with a silicate.

The procedure of Example 53 was repeated except a 5 mil film of polypropylene was substituted for the polyester-coated aluminum plate. After imaging and silicate amplification, the plate was run on a lithographic press for over 1000 impressions with satisfactory results.

EXAMPLES 68–78

These examples illustrate the photografting of a variety of azidocarbonyl silanes to a polyester substrate and then amplifying with a silicate.

The procedure of Example 1 was repeated exactly except the azidocarbonyloxypropyl silane indicated was replaced by other azidocarbonyloxy silanes:

EXAMPLE 68

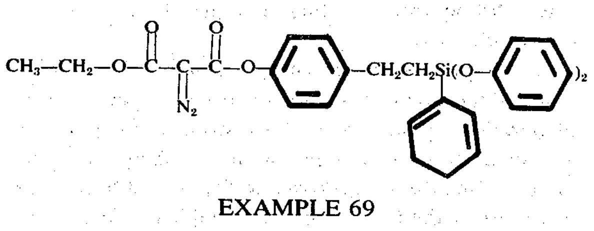

EXAMPLE 69

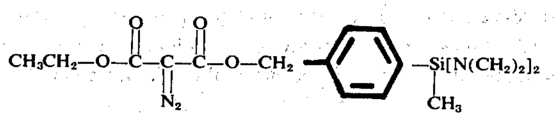

EXAMPLE 70

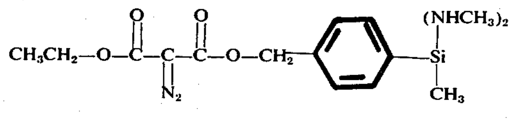

EXAMPLE 71

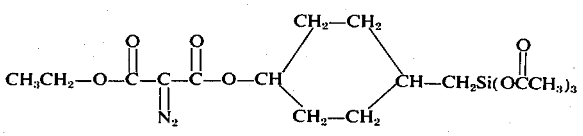

EXAMPLE 72

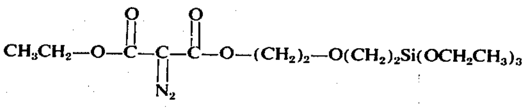

EXAMPLE 73

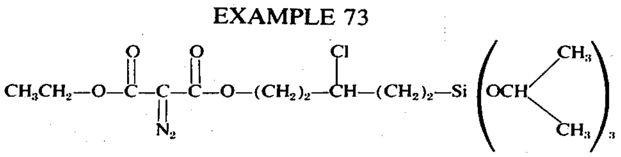

EXAMPLE 74

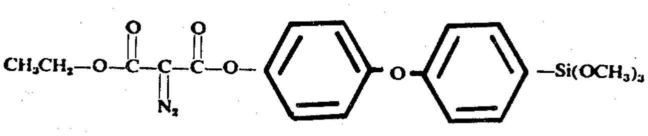

EXAMPLE 75

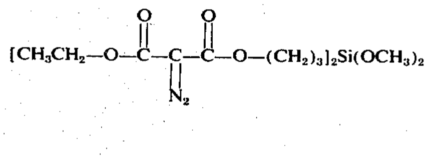

EXAMPLE 76

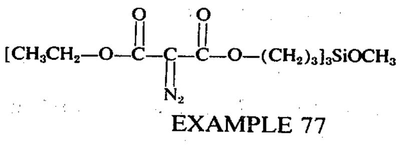

EXAMPLE 77

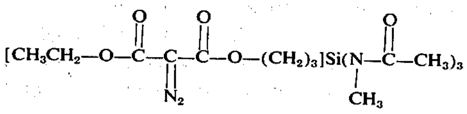

EXAMPLE 78

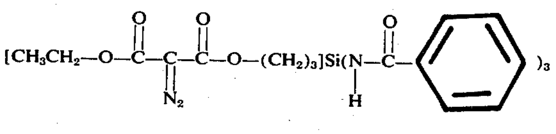

In each example, the plate was run on a lithographic press for over 1000 impressions with satisfactory results.

What we claim and desire to protect by patent is:

1. A process for preparing a lithographic printing plate which comprises the following steps:

a. photografting imagewise to an oleophilic organic polymer substrate a hydrolyzable azo- or azidosilane compound having the general formula $$(X)_a\text{—}\overset{(T)_b}{\underset{}{Si}}\text{—}(R\text{—}Z)_c$$

where R is an organic radical, X is selected from mono and dialkylamino, alkyl and aryl amido, alkoxy, aryloxy and alkyl and aryl oxycarbonyl radicals; T is selected from alkyl, cycloalkyl, aryl, alkaryl, and aralkyl radicals and the corresponding halogenated radicals; $a$ is an integer from 1 to 3; $b$ is an integer from 0 to 2; $c$ is an integer from 1 to 3; and $a+b+c$ equals 4; and Z is selected from

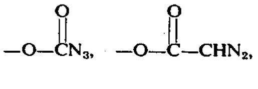

and

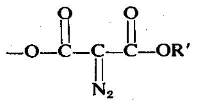

where R′ is selected from alkyl, cycloalkyl, aryl, alkaryl and aralkyl radicals;

b. washing away non-photografted azo- or azido-silane compound from unexposed areas; and c. amplifying the hydrophilicity of the hydrolyzed silane groups by treating with at least one amplifying agent selected from soluble silicate solutions and colloidal silica dispersions.

2. The process of claim 1 wherein the oleophilic organic polymer substrate is a crosslinked polyester resin.

3. The process of claim 1 wherein the amplifying agent is a silicate.

4. The process of claim 1 wherein the amplifying agent is colloidal silica.

5. The process of claim 1 wherein the amplifying agent is a mixture of a silicate and colloidal silica.

6. A lithographic printing plate prepared by the process of claim 1.

7. In a process of preparing a lithographic printing plate which comprises photografting imagewise to an oleophilic organic polymer substrate a hydrolyzable azo- or azido-silane compound and washing away non-photografted azo or azido-silane compound from unexposed areas, the improvement of amplifying the hydrophilicity of the silane groups on the photografted hydrolyzed azo- or azido-silane compounds by treating with at least one amplifying agent selected from soluble silicate solutions and colloidal silica dispersions.

* * * * *

UNITED STATES PATENT AND TRADEMARK OFFICE
CERTIFICATE OF CORRECTION

PATENT NO. : 3,905,816

DATED : September 16, 1975

INVENTOR(S) : Harold Boardman & Richard L. Wagner (Case 3)

It is certified that error appears in the above-identified patent and that said Letters Patent are hereby corrected as shown below:

Column 14, Example 50 (last half of formula) of printed patent;

$$[N_2{=}CH_2{-}\overset{\overset{O}{\|}}{C}{-}O{-}(CH_2)_3]SiOCH_3$$

should read $$[N_2{=}CH_2{-}\overset{\overset{O}{\|}}{C}{-}O{-}(CH_2)_3]_2SiOCH_3$$

Signed and Sealed this

*second* Day of *December 1975*

[SEAL]

*Attest:*

RUTH C. MASON
*Attesting Officer*

C. MARSHALL DANN
*Commissioner of Patents and Trademarks*